US008389422B2

(12) United States Patent
Stradins et al.

(10) Patent No.: US 8,389,422 B2
(45) Date of Patent: Mar. 5, 2013

(54) RAPID THERMAL PROCESSING BY STAMPING

(75) Inventors: Pauls Stradins, Golden, CO (US); Qi Wang, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 232 days.

(21) Appl. No.: 12/675,117

(22) PCT Filed: Aug. 31, 2007

(86) PCT No.: PCT/US2007/077341
§ 371 (c)(1),
(2), (4) Date: Feb. 24, 2010

(87) PCT Pub. No.: WO2009/029104
PCT Pub. Date: Mar. 5, 2009

(65) Prior Publication Data
US 2011/0130012 A1    Jun. 2, 2011

(51) Int. Cl.
*H01L 21/00* (2006.01)
(52) U.S. Cl. .................... 438/795; 257/E21.324
(58) Field of Classification Search .......... 438/795
See application file for complete search history.

(56) References Cited

U.S. PATENT DOCUMENTS

| 4,242,166 A | 12/1980 | Izumihara | |
|---|---|---|---|
| 4,264,394 A | 4/1981 | Izumihara | |
| 4,567,959 A * | 2/1986 | Prophit | 181/156 |
| 4,583,719 A | 4/1986 | Klingel | |
| 5,827,773 A | 10/1998 | Voutsas | |
| 6,658,763 B2 * | 12/2003 | Morad et al. | 34/412 |
| 6,735,378 B1 * | 5/2004 | Kellerman et al. | 392/416 |
| 6,818,276 B2 | 11/2004 | Bourdelais et al. | |
| 6,875,661 B2 | 4/2005 | Mitzi | |
| 2006/0162840 A1 | 7/2006 | Abraham | |

FOREIGN PATENT DOCUMENTS

| JP | 17-123284 | 5/2005 |
|---|---|---|
| KR | 1020040107755 | 12/2004 |

OTHER PUBLICATIONS

Liu, et al., "Rapid Thermal Response (RTR) Hot Embossing of Micro-Structures", ANTEC, 2004, pp. 933-936.
Mahan, et al., "Rapid Thermal Annealing of HWCVD a-Si:H Films: The Effect of the Film Hydrogen Content on the Crystallization Kinetics, Surface Morphology, and Grain Growth", Conference Paper Presented at the 2005 DOE Solar Energy Technologies Program Review Meeting, Nov. 7-10, 2005, pp. 1-2, Denver, CO.

(Continued)

*Primary Examiner* — Thao Le
(74) *Attorney, Agent, or Firm* — Paul J. White; John C. Stolpa; W. LaNelle Owens

(57) ABSTRACT

A rapid thermal processing device and methods are provided for thermal processing of samples such as semiconductor wafers. The device has components including a stamp (35) having a stamping surface and a heater or cooler (40) to bring it to a selected processing temperature, a sample holder (20) for holding a sample (10) in position for intimate contact with the stamping surface; and positioning components (25) for moving the stamping surface and the stamp (35) in and away from intimate, substantially non-pressured contact. Methods for using and making such devices are also provided. These devices and methods allow inexpensive, efficient, easily controllable thermal processing.

27 Claims, 3 Drawing Sheets

OTHER PUBLICATIONS

Masaki, et al. "Solid phase crystallization of thin films of Si prepared by plasma-enhanced chemical vapor deposition", Journal of Applied Physics, Jul. 1993, vol. 74, No. 1.

International Search Report for International (PCT) Application No. PCT/US2007/088341, mailed Apr. 25, 2008.

"Advances in Rapid Thermal and Integrated Processing," edited by Fred Roozenboom—Table of Contents—(NATO Science Series E:, Springer 1996, ISBN 0792340116).

* cited by examiner

RAPID THERMAL PROCESSING BY STAMPING

CONTRACTUAL ORIGIN

The United States Government has rights in this invention pursuant to Contract No. DE-AC36-99GO10337 between the United States Department of Energy and the National Renewable Energy Laboratory, a Division of the Midwest Research Institute.

SUMMARY

A rapid thermal processing device is provided comprising: a stamp having a stamping surface; a heater or cooler operably connected to said stamp; a sample holder for holding a sample in position for intimate contact with said stamping surface; and positioning means for moving into intimate, substantially non-pressured contact, said stamping surface and a sample held by said sample holder, and for removing said stamping surface and sample from said intimate contact, said positioning means being operably connected with said stamp or said sample holder, or both. Methods for using and making such devices are also provided.

Rapid thermal processing is used for a wide variety of applications in semiconductor manufacturing including a-Si:H crystallization, defect annealing, hydrogen diffusion and passivation, dopant activation, thermal oxidation, metal reflow and chemical vapor deposition. It is also used for thin film processing in the photovoltaic and other industries. "Advances in Rapid Thermal Processing," edited by Fred Roozenboom (NATO Science Series E:, Springer 1996, ISBN 0792340116).

Conventional rapid thermal processing is used in the semiconductor manufacturing industry for heating silicon wafers or silicon-containing wafers to high temperatures (up to the silicon melting point 1400° C.), generally for a period of short time. In the past, rapid heating has been achieved using high-intensity lamps or laser processes. Placing the sample on a heated or non-heated plate for processing samples in an oven are also conventionally used for thermal processing. In the rapid thermal processing method described herein, rapid heating of wafers is achieved by intimate contact with a heated stamp.

The rapid, thermal processing method described herein provides unexpected benefits in that it is less expensive than previous methods, and can achieve desired results, such as crystallization of hydrogenated amorphous silicon a-Si:H in less time, e.g., seconds or milliseconds rather than minutes or hours. In addition temperature control is more exact. Because of the rapid, direct contact of the sample surface with the thermal stamp, which has high thermal conductivity (typically the stamp has greater thermal conductivity than the sample), high rates of heating and cooling can be achieved. Heating of the sample is achieved more rapidly by the direct contact of the sample with the heated stamp than with prior methods. Cooling by contacting the sample with a cooled stamp as described herein is also achieved more rapidly than by conventional methods of contacting the sample with ambient gas, which has low thermal conductivity, or with cooled oil, which contaminates the sample surface, or by allowing dissipation of heat to the sample substrate or surface holder plate, both of which are heated up during the process. The stamp described herein is kept at a constant cold temperature, which avoids these problems.

Mechanical contact of the stamp with the sample surface allows fixing of the temperature of the sample near its surface, within the heat diffusion depth, at a selected temperature required for the desired processing to occur, and thus is ideally suited for rapid thermal processing of thin films or wafers, in the photovoltaic and semiconductor industries. The device can be used for any application where rapid processing for heating or cooling of a surface is required. For example, the device and process hereof can be used for annealing, a heat treatment that alters the microstructure of a material causing changes in properties such as strength and hardness, or heating of glass to remove stress, or to activate adhesion of a surface or other applications known to the art.

Figure 1:
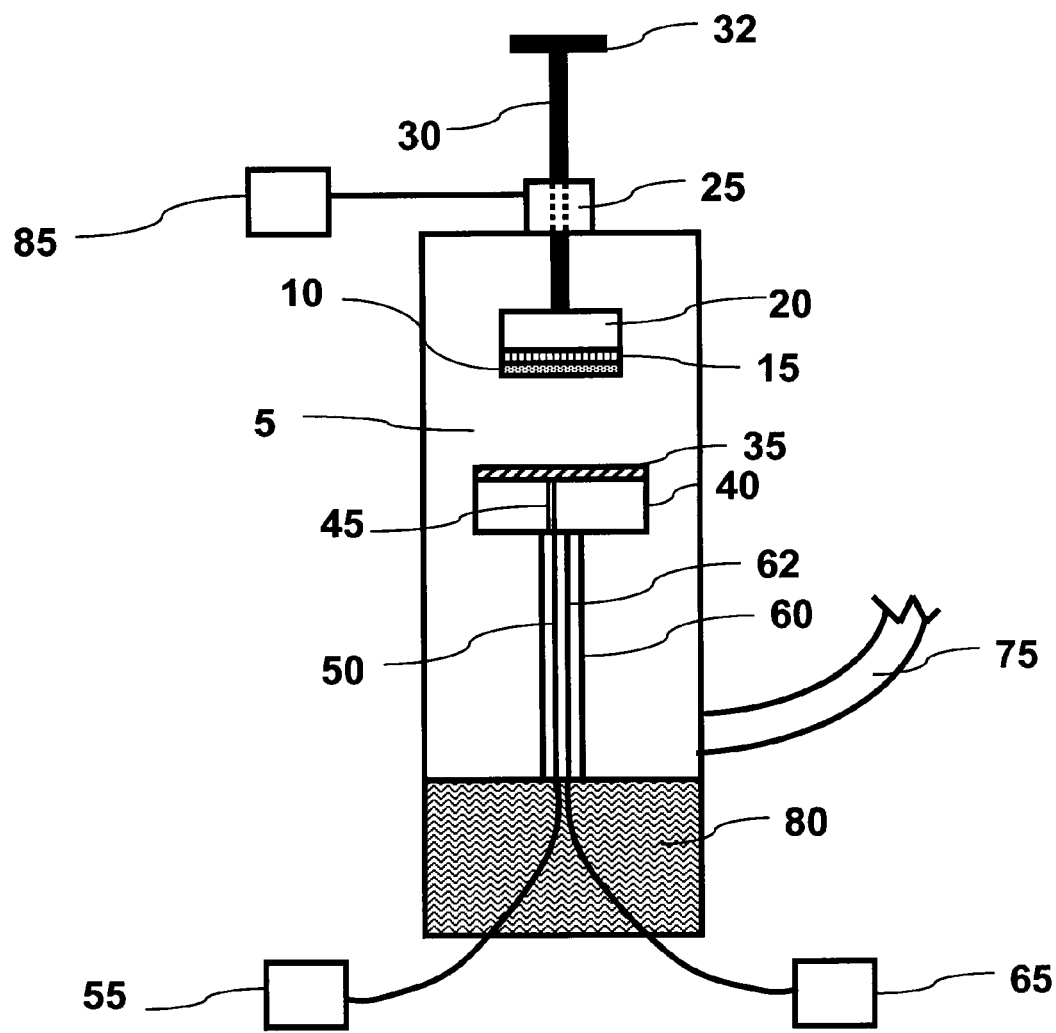
FIG. 1 is a cross-sectional view of a rapid thermal processing device as described herein.

Exemplary embodiments are illustrated in referenced figures of the drawings. It is intended that the embodiments and figures disclosed herein are to be considered illustrative rather than limiting.

DESCRIPTION

In the rapid thermal processing method hereof, the surface of the material to be processed is rapidly mechanically contacted with a stamping surface of a material kept at selected temperature. This allows rapid heating or cooling of the material to be processed. In addition, thermal spatial patterns can be applied to the surface by a stamp having a patterned stamping surface.

The device provided herein comprises a stamp having a stamping surface for contacting a sample surface. The stamp can be made of any material capable of being maintained at the required temperature. It is often important, for example in processing semiconductor wafers, that the stamp is made of a material that is clean and non-reactive with the sample material(s). Silicon is an ideal material for this use. Other materials useful for this purpose include quartz crystal and metals. It is desirable but not necessary that the stamp have higher thermal conductivity than the sample.

The surface of the stamp can be flat or curved in such a way as to conform to the shape of the sample. The stamp can also be in the form of a roller. In addition, the stamp can be patterned with raised portions, so that heat or cold is transferred to the sample to impart a pattern of heat or cold processing to the sample surface.

The stamp is heated or cooled by conventional heating or cooling means to bring it to the selected temperature required for processing the sample, and to keep it at this temperature when a plurality of samples are being sequentially contacted with the stamp. For example, the stamp can be part of, or in contact with a heater comprising heating elements, such as electronic heating elements. Control of the heating elements is achieved by means such as a power variac that is manually controlled or mechanically controlled, e.g., under control of a processor linked with a thermocouple in contact with the stamping surface to provide thermostatic control thereof and maintain the temperature of the stamping surface at a selected temperature. The stamp can, alternatively, be part of, or in contact with a cooler comprising cooling elements, e.g., circulating liquid nitrogen or cold water.

The sample can be any sample requiring thermal processing by heat or cold. As discussed above, semiconductor wafers are especially suited to processing by the methods and devices described herein. Crystallization of a-Si:H thin films is an important application for these methods and devices. Typically, a thin film is less than 100 μm thickness, often 1 μm or less in thickness, e.g., 10 to 1000 nanometers thick. The sample comprising a thin film is typically a substrate, such as glass, on which a thin film has been placed, e.g., by chemical vapor deposition. Crystallization of these films can be done using the methods and devices described herein in place of conventional processing. Such conventional processing is described, e.g., in U.S. Pat. No. 5,827,773 issued Oct. 27, 1998 to Voutsas for "Method for Forming Polycrystalline Silicon from the Crystallization of Microcrystalline Silicon," and Mahan, A. H., et al. (2005), "Rapid Thermal Annealing of HWCVD a-Si:H films: The Effect of the Film Hydrogen Content on the Crystallization Kinetics, Surface Morphology, and Grain Growth," Conference Paper NREL/CP-52-38953 (2005), both of which references are incorporated herein in their entirety for purposes of written description and enablement.

The sample can also be any other material known to the art in which rapid thermal processing is desirable. For example, it can be metal on a semiconductor, p-type or n-type dopants on thin films or silicon nitride on c-Si.

The sample holder is a component designed to hold the sample so that it can be positioned in intimate, substantially non-pressurized contact with the stamping surface. The term "non-pressurized" means that the pressure is not enough to cause deformation or breakage of the sample. The contact is meant only to produce chemical and/or micro-structural changes in the material of the sample, not to physically deform the sample. "Intimate contact" means that as much of the stamping surface as is possible is in contact with the sample surface (given the three-dimensional conformation of these surfaces). It is understood that when the stamping surface is patterned with raised portions, only the raised portions are in intimate contact with the sample, and that when the stamping surface is the surface of a roller, intimate contact of the stamping surface with the sample applies only to the portion of the roller that is in contact with the sample surface at any given time.

It is in some cases desirable that the intimate contact between the stamping surface and the sample surface be as uniform and simultaneous as possible. Because of small deformations in either surface, or tilting of the surfaces with respect to each other upon initial contact, this simultaneous uniform contact over the entire surface of the sample and stamping surface is sometimes difficult to achieve. In these cases, the sample holder can be provided with means to accommodate the sample surface to the stamping surface. For example, in an embodiment, the sample holder comprises a back surface, sides with flanges to hold the edges of the sample, and springs spaced on the back surface between the sample and the back surface to allow the sample to conform to the stamping surface when they come into contact. Other means known to the art may also be used to ensure simultaneous uniform contact of the sample surface with the stamping surface.

The stamp and sample holder are desirably enclosed within a sealed chamber from which air can be removed to form a vacuum, or in which the air can be replaced by inert gases such as argon or nitrogen, to form a non-reactive environment for the rapid thermal processing. Desirably, oxygen is excluded from the chamber so as to avoid oxidation of the sample or other components. Sealed chambers are known to the art and readily available for use in the devices described herein.

The stamping and sample surfaces are brought together into intimate contact and removed from intimate contact by positioning means that can be operated manually or automatically. The positioning means can be operably connected with the stamp, with the sample holder, or with both. When the device is manually operated, the sample holder containing the sample may be attached to positioning means including a shaft extending into the sealed chamber, and positioned in line with the stamp. An operator can operate the shaft to bring the sample into intimate contact with the stamping surface, and remove it from such intimate contact after a selected period of time required for the thermal processing. The positioning means can also include devices such as a bellows and/or a stop placed around the shaft to slow or stop the movement of the shaft so that no pressure will be exerted by the sample on the stamp. As will be appreciated by those skilled in the art, the stamp may be the movable component rather than the sample holder, or both may be movable.

When the device is automatically operated, the positioning means can comprise motors, gears, shafts, arms, hinges, and other devices known to the art for moving mechanical components. The device can also comprise timing means operably connected with the positioning means to remove said stamping surface from said intimate contact with said sample after a selected annealing or cooling time. The positioning means can be operated by activation by a signal connected to the timing means, e.g., a processor programmed to send signals to move the sample holder and stamp into and out of intimate contact, maintaining the contact for a selected time period.

In an embodiment, the heater is capable of heating the stamping surface to a temperature up to about 1200° C. The temperature is selected so as to be high enough to efficiently cause the desired thermal processing without melting the stamping surface. As will be appreciated by those skilled in the art, the selected time for maintaining contact between the sample and stamping surface depends on the temperature at which the stamping surface is maintained, and the selected temperature depends on the selected contact time. These contact times and temperatures can be selected by one of skill in the art depending on the materials used, the atmosphere in which the contact is conducted, and other considerations known to the art without undue experimentation.

In an embodiment, the stamp comprises a cooling element capable of cooling and maintaining the stamping surface to a temperature down to about −200° C., e.g., using liquid nitrogen or other cooling agent such as water, depending on the purpose of the cooling. For example, when the purpose of the cooling is to remove heat applied during hot stamping, the stamping surface is maintained at a temperature of between about −200° C. and about 200° C.

The device may comprise an array of stamps and sample holders. In an embodiment where the sample is first contacted with a heated stamp and then with a cooled stamp, the device comprises both the heated and cooled stamps and means for moving the sample from one to the other, or means for moving the stamps successively into contact with the sample. Other devices may contain two or more heated stamps for example, for successively imparting different treatments to portions of the samples, and means for moving the stamps and sample surface into contact. In addition, arrays may comprise two or more sample holders, or sample holders comprising means for holding two or more samples, so that samples can be efficiently contacted with the same stamp. Other devices can contain both multiple sample holders and multiple stamps, all as required for efficient processing.

The positioning means can be capable of sequentially moving stamps and sample surfaces into intimate contact sequentially or simultaneously, or both.

Methods of healing or cooling a sample using the devices described herein include placing a sample in said sample holder; heating and/or cooling said stamp to a selected temperature; and operating the positioning means to bring said sample and said stamp into intimate contact with each other for a selected time period. The methods are desirably performed by ensuring that the contact between the sample and the stamping surface occurs within a sealed chamber having a non-reactive atmosphere.

Devices as described herein may be constructed by assembling components that are commercially available or can be fabricated or modified for the purposes required herein. To make the devices, a stamp having a stamping surface is provided and operably connected to a heater or cooler. A sample holder is also provided for holding a sample in position for intimate contact with said stamping surface. The sample holder and/or stamp are operably connected to positioning means for moving the stamping surface and sample held by the sample holder into intimate, substantially non-pressured, contact and for removing the stamping surface and sample from the intimate contact. Other components of the device, such as the sealed chamber, timing means, and heating and cooling controls, either manual or automatic, can also be assembled and operably connected to the sample holder and/or stamp.

In addition to the exemplary aspects and embodiments described above, further aspects and embodiments will become apparent by reference to the drawings and by study of the following descriptions.

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

FIG. 1 is a cross-sectional view of an embodiment of a rapid-processing stamping device. The device comprises a sealable chamber 5, which may be positioned on a base 80. Chamber 5 is fitted with a gas conduit 75 through which air or inert gas, such as nitrogen or argon, can be pumped in or out of the chamber to produce a vacuum or substantially non-reactive gas environment within chamber 5. In particular, it is desirable that oxygen be excluded from the chamber during operation.

A sample 10, such as a thin-film semiconductor material, backed by a substrate 15, which can be, for example, glass, is held in sample holder 20. In the embodiment shown, sample holder 20 is attached to shaft 30, which serves as a means to position sample holder 20 such that sample 10 is in intimate contact with the stamping surface of stamp 35. Shaft 30 may be equipped with a handle 32 for manual operation of the device.

In some embodiments, such as embodiments in which sample 10 is manually moved into contact with stamp 35, mechanical positioning means 25 can comprise a stop having a height sufficient to allow sample holder 20 to be lowered only far enough so that sample 10 touches the stamping surface of stamp 35, but not so far as to exert substantial pressure by sample 10 on the stamping surface. Mechanical positioning means 25 can also comprise a bellows to slow movement of shaft 30.

In an embodiment, mechanical positioning means 25 can comprise automatic means such as a motor-and-gear arrangement or other such means known to the art for moving the sample into contact with the stamping surface.

In an embodiment, timing means 85 is connected with mechanical positioning means 25, which comprises automatic means for moving the sample. In this embodiment, timing means 85 comprises a processor programmed to send a signal to mechanical means 25 to move sample holder 20 so as to position sample 10 in intimate contact with the stamping surface of stamp 35. In an embodiment, substantially no pressure is exerted by the sample on the stamping surface. The processor is also programmed to move sample holder 20 so as to remove sample 10 from intimate contact with the stamping surface. In an embodiment, sample 10 is moved far enough from stamp 35 so that substantially no transfer of temperature from stamp 35 to sample 10 occurs. This distance can be determined empirically by one skilled in the art without undue experimentation depending on the size and material of sample 10 and stamp 35, the atmosphere or lack thereof within chamber 5, and any other relevant parameters. Typically, for thin-film wafers, this distance would be at least about a few centimeters.

Stamp 35 is part of, or is attached to, heater or cooler 40, which comprises heating or cooling elements (not shown). In the case where element 40 is a heater, it is connected by heating or cooling conductors 62 to a power variac 65 by which the temperature of the stamping surface can be selected. Heating or cooling conductors 62 can be power wires for supplying heat to element 40 when it is a heater. Element 40 can also be a cooler, in which case element 62 is a conduct for cold substances, such as liquid nitrogen or others known in the art. The heater or cooler 40 is placed in contact with stamp 35. A thermocouple 45 is also in contact with stamp 35 so that the temperature of the stamping surface can be monitored. Thermocouple 45 is connected via thermocouple connector wires 50 to thermocouple temperature processor 55 which can comprise a temperature display useful to monitor the temperature of the stamping surface. The thermocouple connector wires 50 and heating or cooling conductors 62 are contained within optional conduit 60, which may be a plastic or metal tube or other suitable conduit known in the art.

In an embodiment, temperature processor 55 can be controllably connected with the power variac 65 such that automatic control of the temperature is provided.

As will be appreciated by those skilled in the art, the device may be configured such that stamp 35 and heater or cooler 40 are connected to mechanical positioning means 25 rather than sample holder 20; or both the stamp 35 and heater or cooler 40 and sample holder 20 may be connected to mechanical positioning means 25, so long as the device comprises means for bringing sample 10 into intimate contact with the stamping surface of stamp 35.

Figure 2:
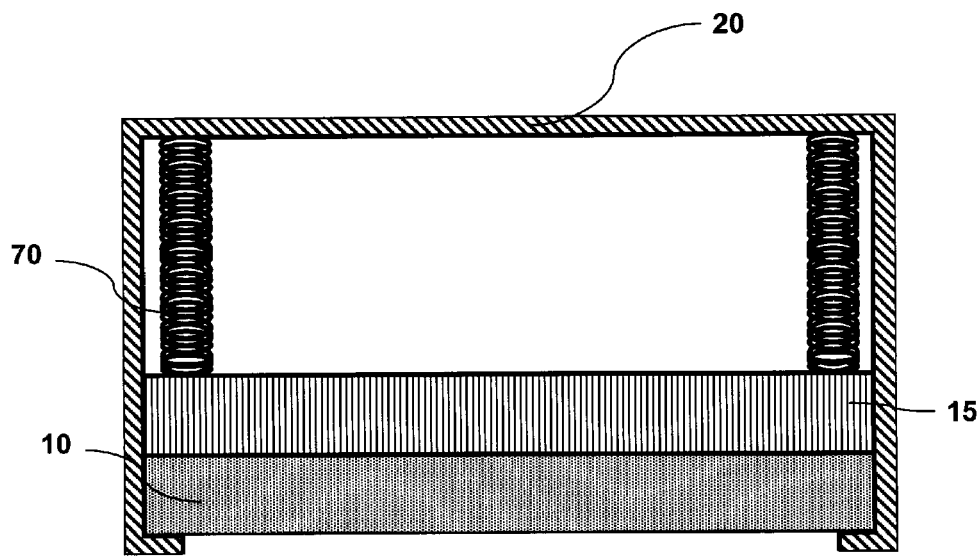
FIG. 2 is an enlarged cross-sectional view of a sample holder of the device holding a sample and substrate.

FIG. 2 is an enlarged cross-sectional view of a sample holder 20 of the device holding sample 10 and substrate 15. Springs 70 are attached to sample holder 20 so that the positioning of the sample can accommodate to any tilting or roughness of the stamping surface. Sample holder 20 is, of course, sized and shaped so as to effectively hold sample 10 in position for contact with the stamping surface of stamp 35. In an embodiment in which the sample 10 is a rectangle wafer, such as is used in the semiconductor industry, the sample holder 20 will desirably be equipped with springs 70 at all four corners.

Figure 3:
FIG. 3 is an enlarged cross-sectional view of a stamp of the device having a patterned surface.

FIG. 3 is an enlarged cross-sectional view of a patterned stamp 36. When such a stamp is used to anneal a sample, for example to produce crystallization of a hydrogenated amorphous silicon wafer, the crystallization will occur only where the raised portions forming the stamping surface of patterned stamp 36 contacts the sample.

Element 40 (see FIG. 1) can be a heater or can be a cooler. In an embodiment, sample 10 is first positioned in intimate contact with a hot stamp, and then, for rapid cooling, is placed in intimate contact with a cold stamp.

To operate the rapid-processing stamping device, in an embodiment, a sample 10 on a substrate 15 is placed in sample holder 20. Chamber 5 is then sealed and the air is pumped out via gas conduit 75, or inert gas is pumped in to replace the atmosphere inside chamber 5, which is exhausted through valve means (not shown).

Power variac 65 is operated to supply power via heating or cooling conductors 62 to heater 40 to reach a selected temperature that is hot enough to provide the desired change in the material of sample 10 without destroying it or distorting it or substrate 15. The temperature of stamp 35 is monitored and/or controlled by means of thermocouple 45 connected via connector wires 50 to temperature processor 55, which may display the temperature of the stamp and/or may act as a thermostat to control a power supply 65 for heater or cooler 40 to provide power to achieve the selected temperature. When stamp 35 has reached the selected temperature, sample holder 20 is then moved, manually, or automatically, by mechanical positioning means 25, into intimate contact with the stamping surface of stamp 35. Contact is held for a selected period of time, sufficient to produce the desired change in sample 10, but not so long as to distort or destroy sample 10 or substrate 15. As will be appreciated by those skilled in the art, the selected time and selected temperature are interdependent, and may be determined by those skilled in the art without undue experimentation. The reverse process in which a thermal stamp contacts a fixed sample is also applicable.

When the device is operated manually, handle 32 can be used to move shaft 30 downward, thereby moving sample holder 20 toward stamp 35. When handle 32 reaches mechanical positioning means 25, which in this case comprises a stop, the sample holder 20 will be positioned such that sample 10 is in intimate contact with the stamping surface of stamp 35, and no additional pressure can be exerted. Springs 70 (FIG. 2) help ensure that the surface of sample 10 and the stamping surface of stamp 35 are kept in intimate contact despite any tilting or imperfections in the surfaces.

When the device is operated automatically, processor 50 controls the temperature of stamp 35 so that it is heated or cooled to the selected temperature, and timing means 85 controls the timing of contact between the sample 10 and the stamping surface of stamp 35. The processor comprised in timing means 85 sends a signal to mechanical positioning means 25 to control positioning of sample 10 and keep it in intimate contact with the stamping surface of stamp 35 for the selected time and then remove it to a distance at which substantially no further heat transfer between sample 10 and stamp 35 occurs.

Devices as described herein may be made by those skilled in the art in accordance with the teachings hereof using components known to the art, many of which are commercially available, with modifications as required for efficient operation and design.

Example

A rapid-processing thermal stamping test device was constructed for manual operation as described above. A Heatwave Labs, Inc., CA, USA button heater up to 1200° C. was used. A flat piece of crystallized silicon (c-Si) was used as the stamp, which was heated by the heater to desirable temperature. Optical reflectance measurement using n& model 1280, from n&k technology, Inc., CA, USA, was used to determine the phase transition of hydrogenated amorphous silicon (a-Si: H) to polycrystalline silicon (poly-Si) as a result of thermal stamping.

Samples used were test pieces made by depositing an a-Si:H film on a glass substrate by hot-wire chemical vapor deposition (HWCVD) to a thickness of about 1 micron. Time to crystallization was determined from a series of rapid stamps at various times. The fastest manual stamp time is at one second. A rapid-processing thermal stamping was conducted on the test piece. Test pieces were placed in the sample holder inside the device chamber. Air was pumped out and the chamber was filled with inert gas (nitrogen —$N_2$) in the chamber. The heater was then activated to raise the temperature of the stamping surface to test temperatures of 600° C., 700° C., 800° C., respectively.

Intimate contact between the test piece and the stamping surface was made at varying temperatures, for a period of time depending on the stamp temperature, after which the test piece was separated about 3 cm from the stamping surface. The sample was then removed from the chamber and tested for crystallization by optical reflectance measurement. The results were compared with results from conventional oven processing of a-Si:H wafers made using HWCVD, (1993) Masaki et al. "Solid phase crystallization of thin films of Si prepared by plasma-enhanced chemical vapor deposition".

Figure 4:
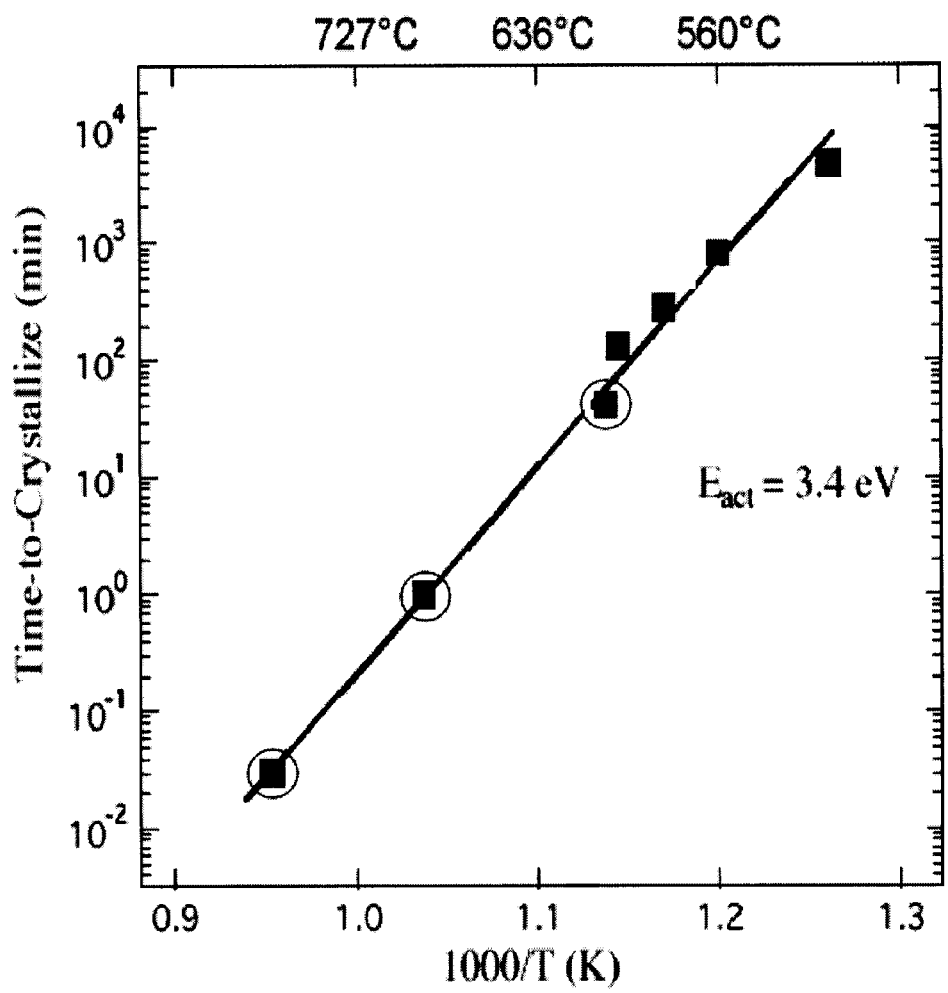
FIG. 4 is a graph comparing the rapid-processing stamp method with standard oven annealing for crystallization of hydrogenated amorphous silicon (a-Si:H) wafers. The "■" designation indicates the use of standard oven technique for solid phase crystallization. The "●" designation indicates the use of the rapid-processing stamp method.

Results are shown in FIG. 4. Circled points indicate annealing by thermal stamping. Uncircled points indicate conventional oven processing. The activation energy of time to crystallization (3.4 eV) from rapid thermal stamping is the same as that from processing using a conventional oven. The advantage of rapid thermal stamp is the fast thermal process at higher-than-glass melting temperatures to crystallize the a-Si:H without distortion of the substrate of glass. Both sample temperature and time can be controlled and measured accurately. In contrast, in the conventional oven approach, processing above this temperature causes distortion of the glass substrate because of difficulties in controlling the time and measuring the sample temperature. The conventional oven approach requires moderate temperatures and longer times for thermal processing to crystallize a-Si:H.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A rapid thermal processing device comprising:
   a stamp having a stamping surface;
   a heater or cooler operably connected to said stamp;
   a sample holder for holding a sample in position for intimate contact with said stamping surface;
   positioning means for moving into intimate, substantially non-pressured contact, said stamping surface and a sample held by said sample holder, and for removing said stamping surface and sample from said intimate contact, said positioning means being operably connected with said stamp or said sample holder, or both; and an array comprising two or more of said stamps each having a heater or a cooler operably connected thereto.

2. The device of claim 1 wherein said stamp is operably connected to a heater.

3. The device of claim 1 wherein said stamp is operably connected to a cooler.

4. The device of claim 1 also comprising:
timing means operably connected with said positioning means to remove said stamping surface from said intimate contact with said sample after a selected annealing or cooling time.

5. The device of claim 4 wherein said timing means is operably connected with said positioning means to remove said stamping surface from said intimate contact with said sample after a selected annealing time.

6. The device of claim 1 wherein said positioning means are operably connected to said stamp.

7. The device of claim 1 wherein said position means are operably connected to said sample holder.

8. The device of claim 1 wherein the components are contained within a sealable chamber.

9. The device of claim 1 wherein said sample and said stamping surface are flat.

10. A rapid thermal processing device comprising:
a stamp having a stamping surface;
a heater or cooler operably connected to said stamp;
a sample holder for holding a sample in position for intimate contact with said stamping surface; and
positioning means for moving into intimate, substantially non-pressured contact, said stamping surface and a sample held by said sample holder, and for removing said stamping surface and sample from said intimate contact, said positioning means being operably connected with said stamp or said sample holder, or both,
wherein said stamping surface is curved.

11. The device of claim 1 wherein said heater is capable of heating said stamping surface to a temperature up to about 1400° C.

12. The device of claim 1 comprising a sample held by said sample holder.

13. The device of claim 12 wherein said sample is a thin film, and said components are contained within a sealed chamber substantially devoid of reactive gases.

14. The device of claim 13 wherein said sample is backed by a substrate.

15. The device of claim 14 comprising:
timing means operably connected with said positioning means to remove said stamping surface from said intimate contact with said sample after a selected annealing time; wherein said annealing time is less than that required to deform said substrate and/or damage said sample.

16. The device of claim 1 wherein said positioning means is capable of sequentially moving said stamps and sample surface into intimate contact.

17. The device of claim 1 comprising at least one stamp having a heater operably connected thereto and at least one stamp having a cooler operably connected thereto.

18. The device of claim 1 wherein said positioning means is capable of moving two or more of said stamps into simultaneous intimate contact with said sample surface, or is capable of moving said sample surface into simultaneous intimate contact with two or more of said stamps.

19. A method of heating or cooling a sample comprising:
providing a rapid thermal processing device comprising:
a stamp having a stamping surface;
a heater or cooler operably connected to said stamp;
a sample holder for holding a sample in position for intimate contact with said stamping surface; and
positioning means for moving into intimate, substantially non-pressured contact, said stamping surface and a sample held by said sample holder, and for removing said stamping surface and sample from said intimate contact, said positioning means being operably connected with said stamp or said sample holder, or both;
placing a sample in said sample holder;
heating and/or cooling said stamp to a selected temperature; and
operating said positioning means to bring said sample and said stamp into intimate contact with each other for a selected time period,
wherein said sample is a thin-film semiconductor component.

20. The method of claim 19 wherein said thin film is a film is a film of hydrogenated amorphous silicon on a substrate.

21. The method of claim 20 wherein said substrate is glass.

22. The method of claim 20 wherein said selected temperature and said selected time are selected so as to crystallize silicon crystals in said film without deforming said film or said substrate.

23. A rapid thermal processing device, comprising:
a stamp comprising a stamping surface;
a heater operable to heat the stamping surface;
a sample holder for holding a sample, comprising a thin film on a substrate, in position with a surface of the thin film opposite the substrate in a position to contact the stamping surface; and
a positioning assembly adapted for placing the stamping surface and the surface of the thin film into the contact position,
wherein the sample holder supports the sample without applying heat to the substrate and wherein the stamping surface is heated by the heater to a temperature above a melting temperature of the substrate.

24. The device of claim 23, wherein the substrate comprises glass.

25. The device of claim 24, wherein the thin film comprises a-Si:H.

26. The device of claim 23, wherein the stamp surface comprises a pattern defined by raised portions and wherein the raised portions contact the surface of the thin film when the positioning assembly operates to place the stamping surface and the surface of the thin film in the contact position, whereby the raised portions define areas of greater heat transfer between the stamp and the sample.

27. A rapid thermal processing device comprising:
a stamp having a stamping surface;
a cooler operably connected to said stamp to cool the stamping surface to a temperature in the range of −200° C. and 200° C.;
a sample holder for holding a sample comprising a thin film on a substrate; and
a positioning assembly for placing the stamping surface and the thin film of the sample held by the sample holder in abutting contact, whereby heat is removed from the thin film.

* * * * *